United States Patent [19]

Kagenishi

[11] Patent Number: 5,406,512

[45] Date of Patent: Apr. 11, 1995

[54] SEMICONDUCTOR MEMORY DEVICE USING COMPENSATION CAPACITORS

[75] Inventor: Yukihiro Kagenishi, Osaka, Japan

[73] Assignee: Matsushita Electronics Corporation, Osaka, Japan

[21] Appl. No.: 166,158

[22] Filed: Dec. 13, 1993

Related U.S. Application Data

[63] Continuation of Ser. No. 721,100, Jun. 25, 1991, abandoned.

[30] Foreign Application Priority Data

Jun. 25, 1990 [JP] Japan .................. 2-167199

[51] Int. Cl.$^6$ .................... G11C 11/24; G11C 7/02
[52] U.S. Cl. .................... 365/149; 365/203; 365/214; 257/296
[58] Field of Search .............. 365/149, 203, 205, 206, 365/214; 257/903, 532, 776, 296

[56] References Cited

U.S. PATENT DOCUMENTS

| 4,792,922 | 12/1988 | Mimoto et al. | 365/149 |
| 4,922,460 | 5/1990 | Furutani et al. | 365/207 |
| 5,058,072 | 10/1991 | Kashimura | 365/203 |

FOREIGN PATENT DOCUMENTS

| 0200500 | 11/1986 | European Pat. Off. | |
| 0133394 | 6/1988 | Japan | 365/149 |
| 2184311 | 6/1987 | United Kingdom | |

OTHER PUBLICATIONS

Aoki et al., *New DRAM Noise Generation Under Half-Vcc Precharge and its Reduction Using a Transposed Amplifier* The Journal of Solid-State Circuits, vol. 24, No. 4 (Aug. 1989).

Krause et al., *Optimized Sensing Scheme of DRAM's*, The Journal of Solid-State Circuits, vol. 24, No. 4, (Aug. 1989).

Okamura et al., *Decoded-Source Sense Amplifier for High-Density DRAM's*, The Journal of Solid-State Circuits, vol. 25, No. 1 (Feb. 1990).

Primary Examiner—Rolf Hille
Assistant Examiner—Peter Toby Brown
Attorney, Agent, or Firm—Willian Brinks Hofer Gilson & Lione

[57] ABSTRACT

The semiconductor device of the present invention utilizes pairs of compensation capacitors serially connected between corresponding pairs of bit lines and interconnected to a ground line of a sense amplifier driver, so that the transitional potential change in the ground line due to reading out current from adjacent memory cells is restricted, thereby eliminating the delay in the level change of the bit lines, thus enabling high speed access.

4 Claims, 5 Drawing Sheets

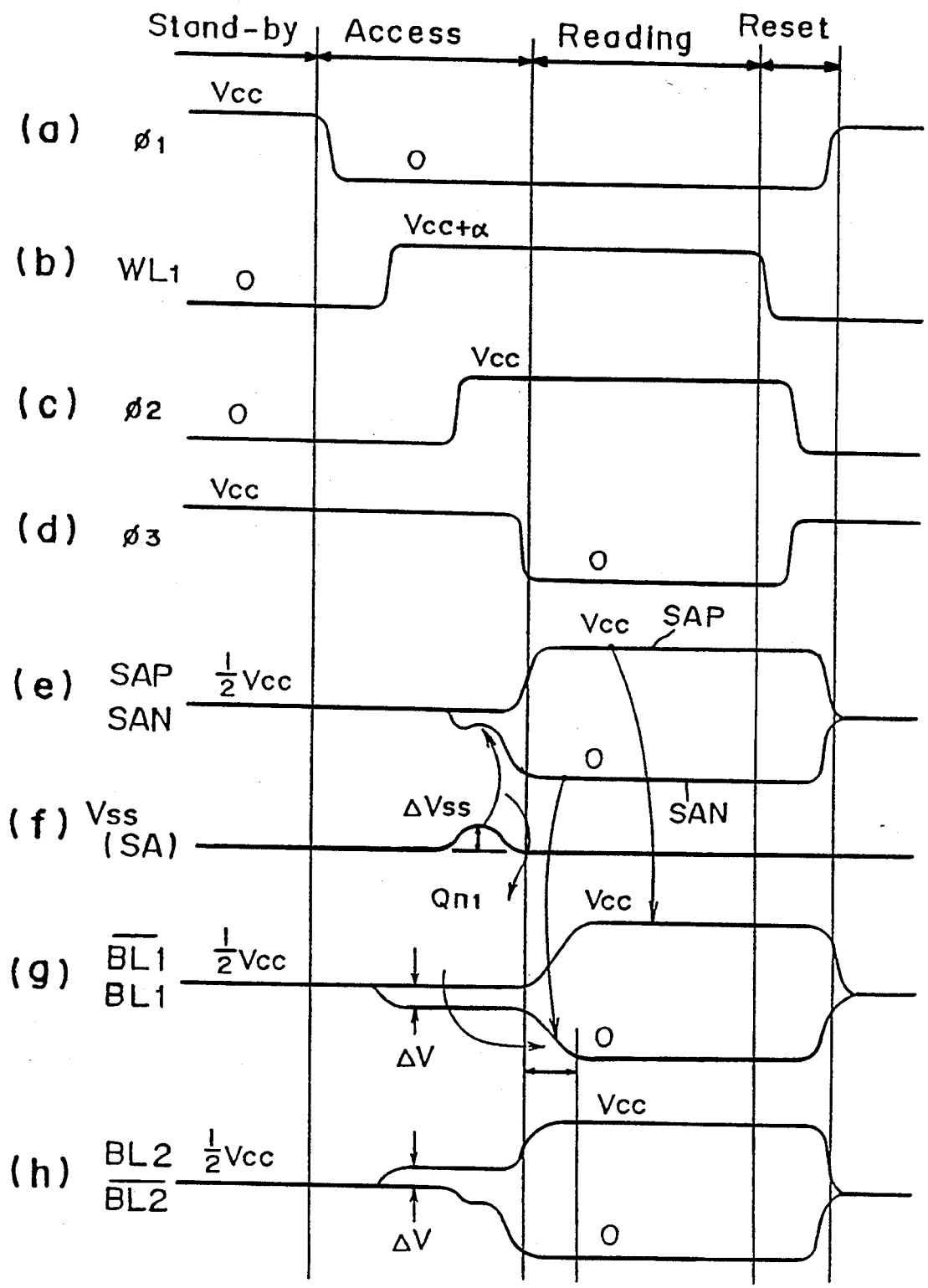

SEMICONDUCTOR MEMORY DEVICE USING COMPENSATION CAPACITORS

This is a continuation of application Ser. No. 07/721,100, filed Jun. 25, 1991, now abandoned.

BACKGROUND OF THE INVENTION

1. Field of the Invention

The present invention relates to a circuit arrangement using compensation capacitors designed to secure a minute signal from a bit line which is input to a sense amplifier in a dynamic semiconductor memory device.

2. Description of the Prior Art

The progress in shrinkage technique in recent years has introduced a tendency towards highly-integrated semiconductor memory devices with large capacity. Particularly, a dynamic random access memory device (referred to as a DRAM hereinafter) leads the trend.

In the DRAM, one-bit data is stored as electric charge in a memory cell comprised of one transistor and one capacitor. When a high signal is input from a word line corresponding to an input row address to a gate of the transistor, the capacitor where the data is stored is connected with a precharged bit line. The potential change of the bit line at this time is amplified by a sense amplifier between the bit line and a reference line in pairs, and transmitted to an output circuit.

The data is read out from the conventional DRAM described above in a manner as follows.

FIG. 4 is a circuit diagram showing the structure of a memory cell array part and the sense amplifiers $SA_1$, $SA_2$, ..., $SA_m$ of the conventional DRAM. Each sense amplifier is comprised of a differential amplifier consisting of a pair of N-type transistors, for example, QN1, QN1', and a pair of P-type transistors, for example, QP1, QP1'. Two bit lines BL1, $\overline{BL1}$ are connected to the sense amplifier SA1 as one pair of inputs. Each bit line BLi (i=1 to m) or $\overline{BLi}$ is connected to each data memory capacitor mCi.1 or mCi.2, which is connected between a MOS transistor Qi.1 or Qi.2 as a transfer gate and a fixed voltage electrode Vcp. The MOS transistor acting as a transfer gate is controlled in response to the selection of a word line among word lines WL1 WL2, ..., WLn. A common node SAP of the P-type transistors and a common node SAN of the N-type transistors of the sense amplifier are connected to precharging transistors Qp, QN and an equalizer transistor QEQ, respectively.

The operation of the conventional DRAM having the circuit structure shown in FIG. 4 will be described with reference to FIG. 5, which is a schematic timing chart of the operation and waveforms of the conventional DRAM.

First of all, the reading operation will be explained by way of example. In the stand-by period before reading, as indicated in the timing chart, a clock $\Phi_1$ is set at Vcc and the equalizer transistor QEQ is turned on thereby, with a clock $\Phi_2$ being set at 0 and a clock $\Phi_3$ being set at Vcc, thereby turning off the precharging transistors QN and QP. Accordingly, the common node SAP (referred to as SAP hereinafter) and the common node SAN (referred to as SAN hereinafter) are set at ½ Vcc, and the transistors QN1, QN1', ..., QNm and QNm' for driving the sense amplifier are kept in the off state. Moreover, bit lines are set at ½ Vcc by means of equalizer transistors and precharging transistors (not shown in FIG. 4). When the DRAM is driven for access, the clock $\Phi_1$ is turned to 0 thereby turning off the equalizer transistor QEQ, releasing the connection between SAP and SAN. The level of a word line corresponding to the input address is raised at a next timing. As a result, capacitors connected to the word line are connected to the respective bit lines and the level of each bit line is changed in response to each charging state corresponding to the data memorized in each capacitor. At a succeeding timing, SAN is set at 0 by turning the clock $\Phi_2$ to Vcc, and SAP is set at Vcc by turning the clock $\Phi_3$ to 0. When SAP is set at Vcc, each sense amplifier detects the above level change, and amplifies the level of the corresponding bit line to Vcc or 0. For example, when the potential of word line WL1 is raised, as indicated in (b) of FIG. 5, the transistor Q1.1 is turned on thereby and, accordingly, the capacitor mc1.1 is connected to the bit line BL1. If it is in the not charge state, a negative level change $\Delta V$ is given to the bit line BL1 as shown in (g) of FIG. 5. Therefore, the bit line BL1 is moved to 0 due to a differential amplification between $\Delta V$ and ½ Vcc of the corresponding bit line $\overline{BL1}$, which is not changed by the word line WL2, so that the bit line $\overline{BL1}$ is moved to Vcc. The same change is brought about in the other capacitors mc2.1, ..., mcm.1, connected to the word line WL1. In the manner as above, the charging state of each capacitor corresponding to the word line is read out as the level change of each bit line. When the reading operation is completed, the potential of the word line is finally turned off after a predetermined reset period. The level of each bit line is thus held in the respective capacitor.

In the conventional DRAM mentioned above, all the currents read out from respective capacitors corresponding to the word line flow into a Vss line. At this time, the falling state of the aforementioned SAN is affected by the impedance of Vss, which is reflected to the operation of the differential amplifier, thereby causing a delay in the level shift of the bit line.

This will be explained in more detail with respect to the case where the capacitor mc2.1 is in a charged state. Assume that SAN and SAP are driven by raising the potential of clock $\Phi_2$ to Vcc and then dropping the potential of clock $\Phi_3$ to 0 after the word line WL1 raised, as indicated in (c) and (d) of FIG. 5. When WL1 is raised up, the level of BL1 is reduced by $\Delta V$, while that of BL2 is increased by $\Delta V$, as shown in (g) and (h) of FIG. 5. Thereafter, SAN starts to fall to 0. At this time, SAP, $\overline{BL1}$ and $\overline{BL2}$ remain at ½ Vcc, and the P-type transistors of each differential amplifier are kept in the off state, whereas only the N-type transistors are driven due to the potential difference between the gate and SAN. It is so designed that the potential difference to turn on the N-type transistors at this time should exceed the aforenoted $\Delta V$. Therefore, as indicated in the timing chart of FIG. 5, no level change is produced by the $\Delta V$ change of the bit line caused by the word line. Subsequently, almost at the same time when SAN starts to fall by the rise of the clock $\Phi_2$, QN2' allows a current to flow since it starts with the potential difference $\Delta V$ from the beginning, and $\overline{BL2}$ alike starts to fall. Meanwhile, although QN2 starts from the potential difference 0, it is turned off due to the level fall of the gate by BL2, and BL2 is maintained at ½ Vcc+$\Delta V$. On the other hand, since QN1' starts from a disadvantageous potential difference, i.e., the gate is $\Delta V$ lower than the source, the change of the QN' level is behind the fall of the SAN level, and $\overline{BL1}$ remains at ½ Vcc until then. QN1 is, starting from the potential difference 0, slower to fall than SAN. The BL1 level is maintained at ½ Vcc−ΔV until then. As the above-described operation is carried out for many capacitors, a current equivalent to the reading current of QN2' is produced at many capacitors. Therefore, when the impedance of Vss line is high, as shown in (f) of FIG. 5, ΔVss voltage is generated in Vss line and the SAN level is raised as indicated in (e) of FIG. 5. As a result, QN1 and QN1' are hindered from being changed in level, delayed until SAN recovers to Vss after the capacitors are completely discharged. Thereafter, when the clock $\Phi_3$ is dropped to 0 in order to raise SAP to Vcc, $\overline{BL1}$ and BL2 are raised to Vcc in correspondence to the level fall of BL1 and $\overline{BL2}$, respectively. Waveforms in FIG. 5 represent the result of the delay in total. The delay in the level change of the bit lines as noted hereinabove necessitates a waiting time for the sense amplifier to obtain the driving margin, making it hard to achieve high-speed access.

SUMMARY OF THE INVENTION

The present invention has been devised to solve the above-described disadvantages inherent in the prior art, and has for its essential object to provide a DRAM capable of securing a margin for a sense amplifier and realizing high-speed access with the quick level change of a bit line.

In order to accomplish the above-described object, according to the present invention, a pair of compensation capacitors are inserted between an input terminal of a pair of bit lines and a Vss line of sense amplifiers of a DRAM.

The compensation capacitors change the level of a pair of bit lines in compliance with the change of the Vss line, so that the change in the source level of N type transistors of the sense amplifier can be negated, thereby reducing the operation delay.

BRIEF DESCRIPTION OF THE DRAWINGS

This and other objects and features of the present invention will become apparent from the following detailed description taken in conjunction with one preferred embodiment thereof with reference to the accompanying drawings, in which:

FIG. 5 is a timing chart of the operation of the conventional semiconductor memory device of FIG. 4.

DETAILED DESCRIPTION OF THE PREFERRED EMBODIMENT

A semiconductor memory device according to one preferred embodiment of the present invention will be described hereinbelow with reference to the accompanying drawings.

Figure 1:
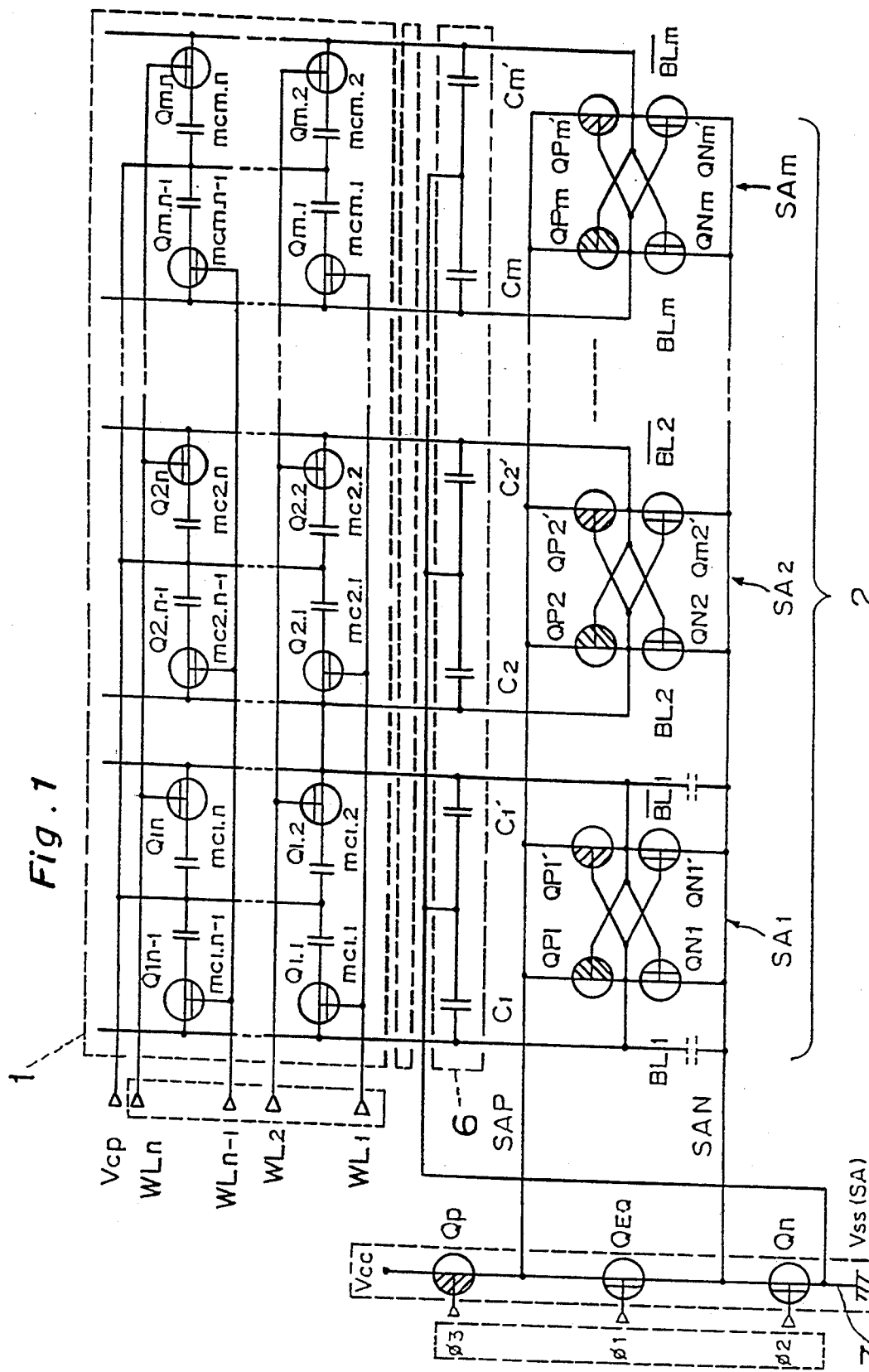
FIG. 1 is a circuit diagram showing the structure of a semiconductor memory device according to one preferred embodiment of the present invention.

FIG. 1 is a circuit diagram showing the structure of the DRAM according to a preferred embodiment of the present invention which is essentially comprised of a memory cell array 1 and a sense amplifier array 2.

Each sense amplifier $SA_i$(i=1 to m) is comprised of a differential amplifier which consists of a pair of N type transistors QNi and QNi' and a pair of P type transistors QPi and QPi' and is arranged so as to be connected between a pair of bit lines BLi and $\overline{BLi}$. To each bit line BLi or $\overline{BLi}$, a data memory capacitor mci.j−1 or mci.j acting as a charge-storage memory is connected at one end thereof via a MOS transistor Qi.j−1 or Qi.j acting as a transfer gate which is controlled by(j−1)-th word line WLj−1 or j-th word line WLj. The other end of the capacitor is connected to a fixed electrode Vcp for charging the same.

A common node SAP of the P-type transistors and a common node SAN of the N-type transistors of each sense amplifier are connected with respective driving transistors QP,QN and an equalizer transistor QEQ.

The structure of the DRAM mentioned above is essentially the same as that of the conventional DRAM. The DRAM according to the present invention is provided with pairs of coupling capacitors C1, C1', . . . , Cm and Cm' each of which is connected between a ground potential line Vss as a source electrode of the driving transistor Qn and each bit line. For example, the i-th coupling capacitor Ci or Ci' is connected between Vss and the i-th bit line BLi or $\overline{BLi}$. The semiconductor memory device of the present invention is different from the conventional one in that the above-described capacitors C1, C1', . . . , Cm, Cm' are provided therein.

Figure 2:
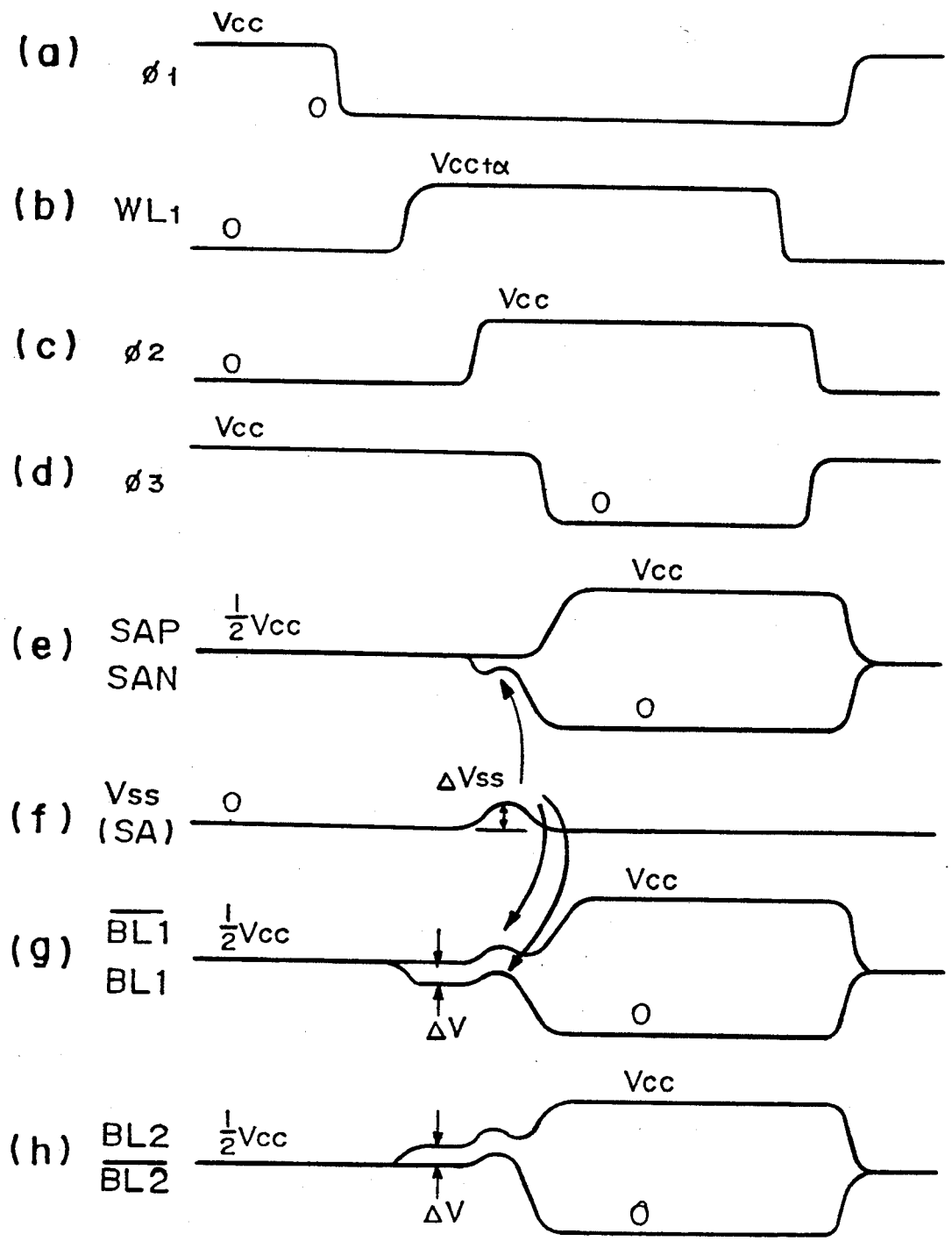
FIG. 2 is a timing chart of the operation of the semiconductor memory device of FIG. 1.

Now, the operation of the semiconductor memory device having the above circuit structure will be discussed with reference to the timing chart of FIG. 2.

At the stand-by time, both transistors Qp and Qn are in the of state, and both SAN and SAP are kept at ½ Vcc by the equalizer transistor QEQ. The sense amplifiers SA1 to SAm connected to these transistors and each bit line are held at ½ Vcc similar to the conventional device. When the DRAM enters a drivable state, the potential of clock $\Phi_1$ is dropped to "L" level and the equalizer transistor QEQ is turned off. Each bit line is turned off by turning off its corresponding equalizer transistor and precharging transistor (not shown in FIG. 1). When the potential of word line WL1 is raised in correspondence to an input address in a reading access, MOS transistors Q1.1, Q2.1, . . . , Qm.1 connected to the word line WL1 are turned on. Therefore, the data memory capacitors mc1.1, mc2.1, . . . , mcm.1 connected to the respective MOS transistors Q1.1, Q2.1, . . . , Qm.1 are connected to the bit lines BL1, BL2, . . . , BLm, respectively. As a result, the potential difference is brought about on each bit line corresponding to the data memorized in the data memory capacitors. Assuming that the potential of BL1 is reduced by ΔV from ½ Vcc and that of BL2 is increased by ΔV from ½ Vcc, the precharging transistor QN is turned on by the clock $\Phi_2$ in order to amplify this potential by each sense amplifier SA1 or SA2 with reference to the ½ Vcc level of the reference bit line $\overline{BL1}$ or $\overline{BL2}$. Such potential changes are caused in each bit line. Thus, read out currents flow into the Vss line from each bit line via the N-type transistors of each sense amplifier, and due to the impedance resulting from the wiring for Vss(SA) within the DRAM, the level of Vss is raised by ΔVss, as shown in (f) of FIG. 2. This rise of ΔVss raises the level of the common node SAN via the precharging transistor QN and the level change of SAN is transmitted to each sense amplifier. Since each pair of bit lines (BL1, $\overline{BL1}$), . . . , (BLm, $\overline{BLm}$) is connected to Vss line via each pair of compensation capacitors (C1, C1'), ..., (Cm, Cm'), the change ΔVss in the Vss level raises the respective potentials of each pair of bit lines, as shown in (g) and/or (h) of FIG. 2. Due to this effect, the change in potential between the source and the gate of each N-type transistor of each sense amplifier is cancelled out. In other words, each level of BL1, $\overline{BL1}$, BL2 and $\overline{BL2}$ is raised by an equal amount, as shown in waveforms (g) and (h) of FIG. 2. Thus, potential difference between BL1 and $\overline{BL1}$ and/or BL2 and $\overline{BL2}$ does not change in spite of the rise of the potential of Vss. Therefore, the potential difference between the pair of bit lines BL1 and $\overline{BL1}$ is amplified by the sense amplifier SA1 without delay in comparison with the potential difference between the pair of bit lines BL2 and $\overline{BL2}$, that is, both potential differences between BL1 and $\overline{BL1}$ and between BL2 and $\overline{BL2}$ are amplified by their respective sense amplifiers simultaneously. Successively thereto, the precharging transistor QP is turned on by a clock $\Phi_3$ and, thereby, the bit lines at "High" side are raised up to Vcc and those at "Low" side are dropped down to zero. After the bit line levels are settled, the word line WL$_1$ is turned off, resulting in all MOS transistors connected thereto being turned off. Thus, each data is stored in each data memory capacitor.

It is to be noted that the compensation capacitors can also be connected between the SAN line and each bit line, as indicated by the dotted capacitor lines between BL1, $\overline{BL1}$ and SAN shown in FIG. 1.

In the DRAM of the present embodiment, each bit line is connected to Vss line by a compensation capacitor, thereby removing the influences of the potential change generated in Vss line by the reading currents and also removing the operation delay of the bit line, while achieving high-speed access.

Figure 3:
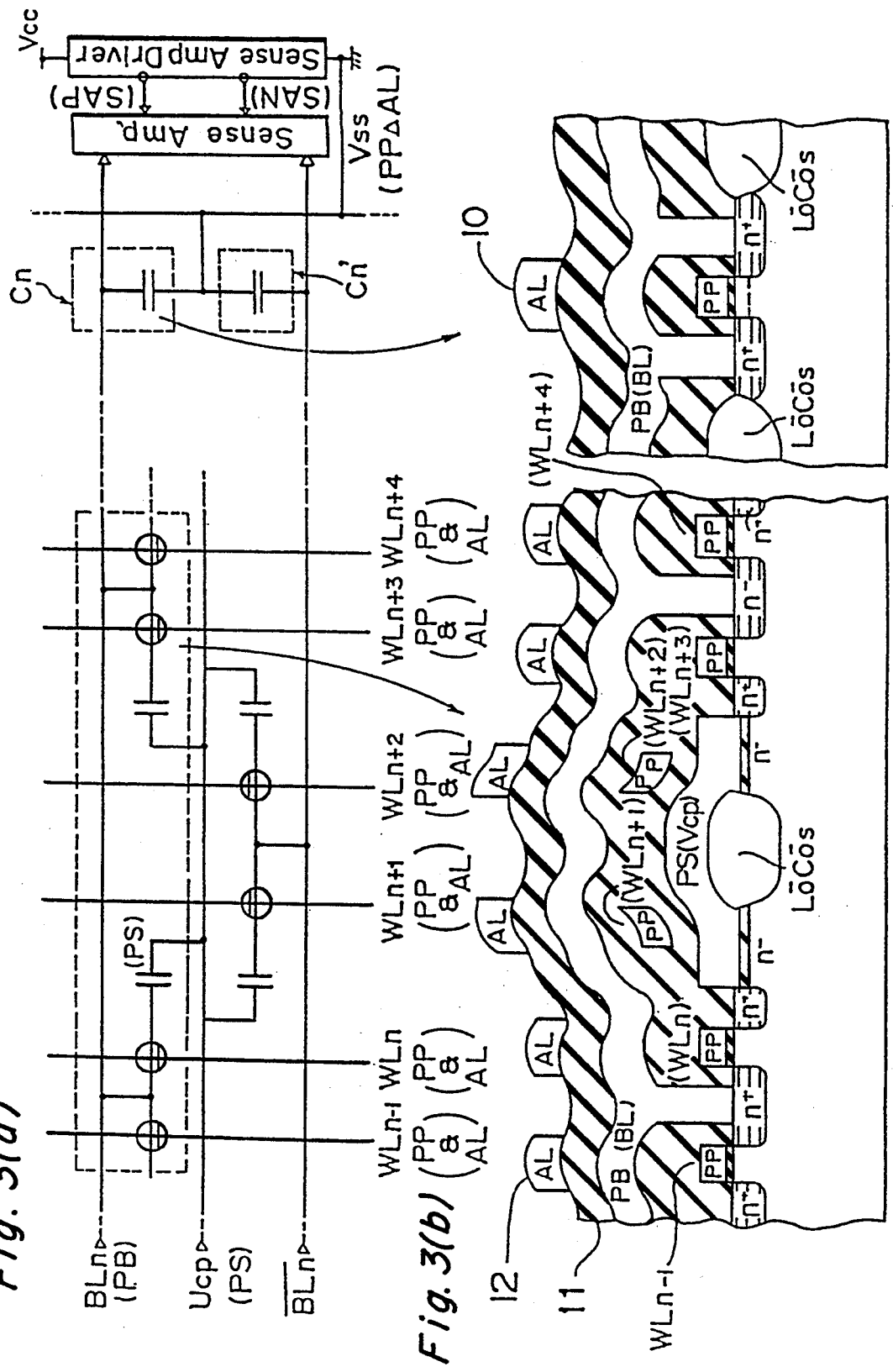
FIG. 3A is a circuit diagram of the semiconductor memory device, the equivalent circuit of which is shown in FIG. 1.
FIG. 3B is a schematical cross-sectional view of the semiconductor memory device, the equivalent circuit of which is shown in FIG. 1.
Figure 4:
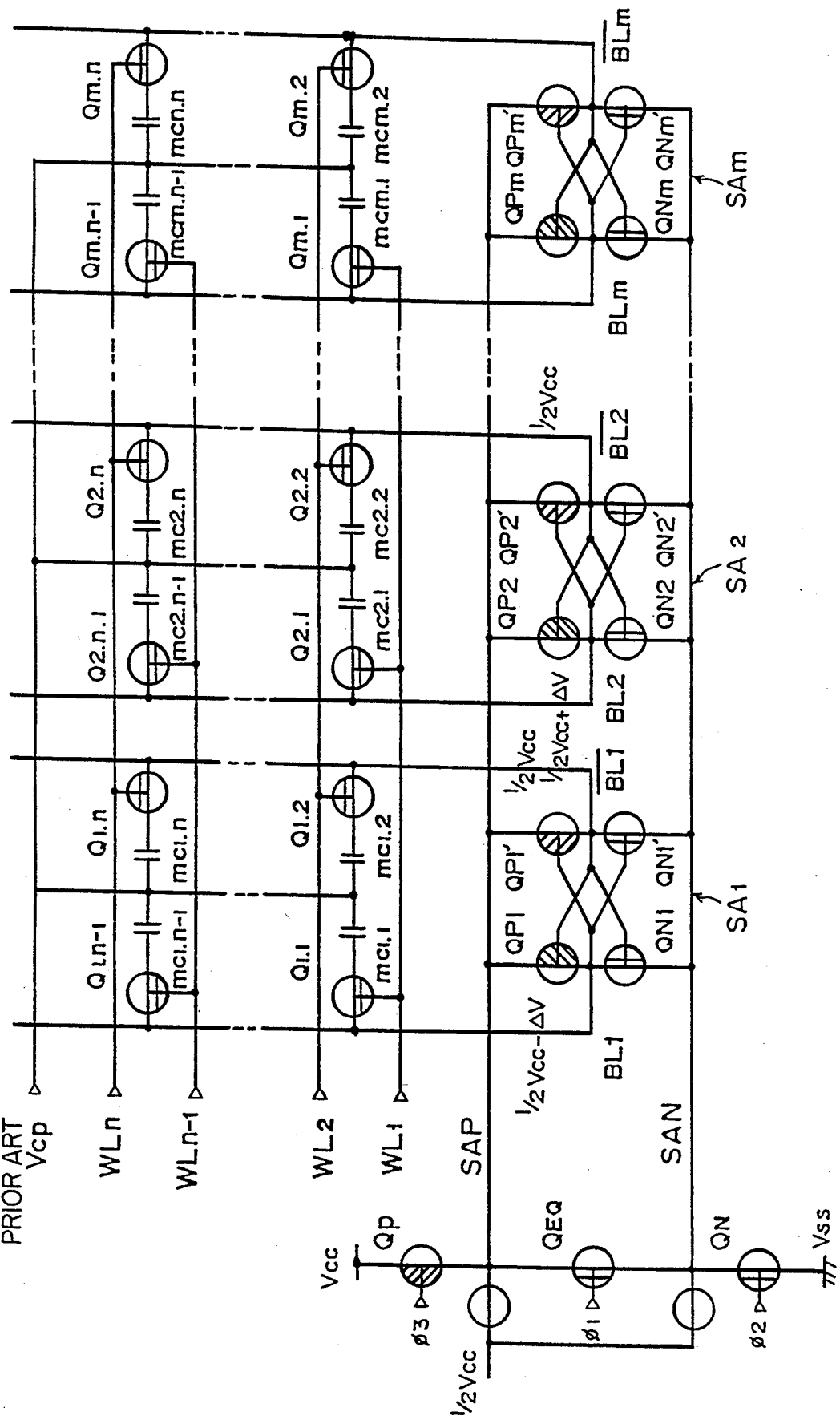
FIG. 4 is a circuit diagram showing the structure of a conventional semiconductor memory device.

A further merit of the present invention is shown in FIGS. 3A and 3B. Each compensation capacitor can be obtained by forming an aluminum pattern line 12 to be connected to Vss line on an inter-layer insulation film 11 covering bit lines. This aluminum pattern line 12 can be easily formed with aluminum word line electrodes 10 using the photolithograpic technique.

The DRAM according to the preferred embodiment of the present invention is different from the conventional DRAM in that the aluminum electrode 10 is provided for forming a compensation capacitor Cn between it and the bit line BLn as indicated in FIGS. 3A and 3B. In FIG. 3B, LOCOS denotes an isolation layer formed by a local oxidization method, n+ or n- denotes n-type doped domain, PS denotes a first polysilicon layer used for forming a fixed electrode Vcp, PP denotes a second poly-silicon layer forming a word line acting as a gate of a switching transistor, PB denotes a laminated layer of metal silicate and poly-silicon and AL denotes an aluminum electrode line.

As is clear from the foregoing description, the semiconductor memory device disclosed herein is provided with memory means for storing bit information from the storing state of electric charges input/output due to the potential change between a word line and a bit line array. A sense amplifier is connected to each pair of bit lines of the memory means to input/output the electric charges, and power source means are provided for feeding the driving source of the sense amplifier from a source line through control of clocks. The pair of bit lines being is connected to the flow-in side of the reading current of the source line by a pair of compensation capacitors. Therefore, it becomes possible to remove the influences of the transitional potential change in the source line by the reading current, and to remove the changing delay in the reading potential of the bit lines, thereby achieving high-speed access.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor memory device comprises a memory cell array for memorizing bit information at each memory cell as a storage state of charge, to be inputted or outputted thereto in response to changes in potential in corresponding word line and bit line arrays, said bit line array comprising a plurality of bit line pairs,
   a plurality of sense amplifiers, one of said sense amplifiers being connected to each pair of bit lines in said bit line array for charging or discharging each memory cell of said memory cell array,
   a sense amplifier driver connected between a power source line and ground line for applying a driving voltage from said power source line to each sense amplifier in response to inputted clock signals, and
   a plurality of compensation capacitor pairs, at least one of which is formed by making an electrode line crossed over one of said pairs of bit lines through an inter-layer insulation film, and said electrode line is simultaneously formed when said word line arrays are formed and is connected to said ground line of said sense amplifier driver whereby each pair of compensation capacitors varies a potential level between each pair of bit lines in accordance with a change in potential of said ground line so that said change in potential of said ground line is negated in each sense amplifier.

2. The semiconductor memory device of claim 1, wherein the memory cell array comprises a data memory capacitor and a MOS transistor connected in series between a bit line and a fixed electrode, the gate of said MOS transistor being connected to a word line.

3. The semiconductor memory device of claim 1, wherein each sense amplifier comprises two P-type transistors and two N-type transistors.

4. The semiconductor memory device according to claim 3, wherein the sense amplifier driver includes a pre-charging P-type transistor connected to the common node of the two P-type transistors of each of the sense amplifiers, a pre-charging N-type transistor connected to the common node of the two N-type transistors of each of the sense amplifiers, and an equalizer transistor connected between said common nodes.

* * * * *